(12) United States Patent
Smithson

(10) Patent No.: US 7,336,940 B2
(45) Date of Patent: Feb. 26, 2008

(54) FREQUENCY CONVERSION TECHNIQUES USING ANTIPHASE MIXING

(75) Inventor: Antony James Smithson, Wotton-under-Edge (GB)

(73) Assignee: Andrew Corporation, Westchester, IL (US)

( * ) Notice: Subject to any disclaimer, the term of this patent is extended or adjusted under 35 U.S.C. 154(b) by 476 days.

(21) Appl. No.: 10/704,336

(22) Filed: Nov. 7, 2003

(65) Prior Publication Data

US 2005/0101267 A1    May 12, 2005

(51) Int. Cl.
*H04B 1/26* (2006.01)
(52) U.S. Cl. .............. 455/326; 455/323; 455/302
(58) Field of Classification Search ........... 455/323, 455/302, 304, 318, 324, 333, 341, 313, 326, 455/303; 325/316, 346
See application file for complete search history.

(56) References Cited

U.S. PATENT DOCUMENTS

| | | | | |
|---|---|---|---|---|
| 3,831,097 A | * | 8/1974 | Neuf | 455/326 |
| 4,509,208 A | * | 4/1985 | Sogo et al. | 455/317 |
| 4,994,755 A | * | 2/1991 | Titus et al. | 330/54 |
| 5,752,181 A | * | 5/1998 | Vice | 455/326 |
| 5,862,466 A | * | 1/1999 | Erickson | 455/321 |
| 5,870,670 A | * | 2/1999 | Ripley et al. | 455/304 |
| 6,073,002 A | * | 6/2000 | Peterson | 455/326 |
| 6,433,647 B1 | * | 8/2002 | Filoramo et al. | 332/103 |
| 6,631,170 B1 | * | 10/2003 | Gu | 375/316 |
| 6,711,395 B1 | * | 3/2004 | Tonegawa et al. | 455/313 |
| 6,745,019 B1 | * | 6/2004 | Thodesen | 455/302 |
| 6,807,407 B2 | * | 10/2004 | Ji | 455/326 |
| 6,839,551 B1 | * | 1/2005 | Wong | 455/314 |
| 6,876,844 B1 | * | 4/2005 | Wong | 455/316 |
| 2001/0018334 A1 | * | 8/2001 | Ipek et al. | 455/318 |
| 2004/0131127 A1 | * | 7/2004 | Nadiri et al. | 375/271 |

* cited by examiner

*Primary Examiner*—Blane J Jackson
(74) *Attorney, Agent, or Firm*—Steve Mendelsohn (57) ABSTRACT

A frequency upconverter using mixers operating on one or more signals and inverted versions thereof and a subtractor, such as a balun, for subtractively combining the mixer outputs to produce an upconverted signal.

20 Claims, 6 Drawing Sheets

FREQUENCY CONVERSION TECHNIQUES USING ANTIPHASE MIXING

FIELD OF THE INVENTION

The invention relates to frequency conversion processes, such as are used in radio communications systems.

DESCRIPTION OF RELATED ART

Information is exchanged in a radio communication system via a modulated radio frequency (RF) carrier wave. Typically, the modulating signal varies either the amplitude or the phase of the carrier wave (called AM and PM, respectively) although in modern communication systems both amplitude and phase are often varied simultaneously as in Quadrature Amplitude Modulation (QAM).

A simple (and therefore cost-effective) way of generating a modulated carrier is by a process known as direct upconversion. Here, a baseband version of the modulated signal is translated from baseband to RF in a single step. In a modern radio communication system, the baseband modulated signal is normally generated digitally and converted into the analogue domain with the use of a digital-to-analogue converter (DAC). If the modulated signal has varying phase and amplitude, then the baseband signal is defined in terms of two independent signals that together define a vector that determines the signal's amplitude and phase. The two independent signals are often specified in the cartesian coordinate system and called I and Q. These define the amplitude of two carrier waves that have a 90° phase difference between them. It is usual to provide a pair of DACs, one for producing each of the I and Q baseband signals. Often, the I and Q signals are provided in differential form.

Figure 1:
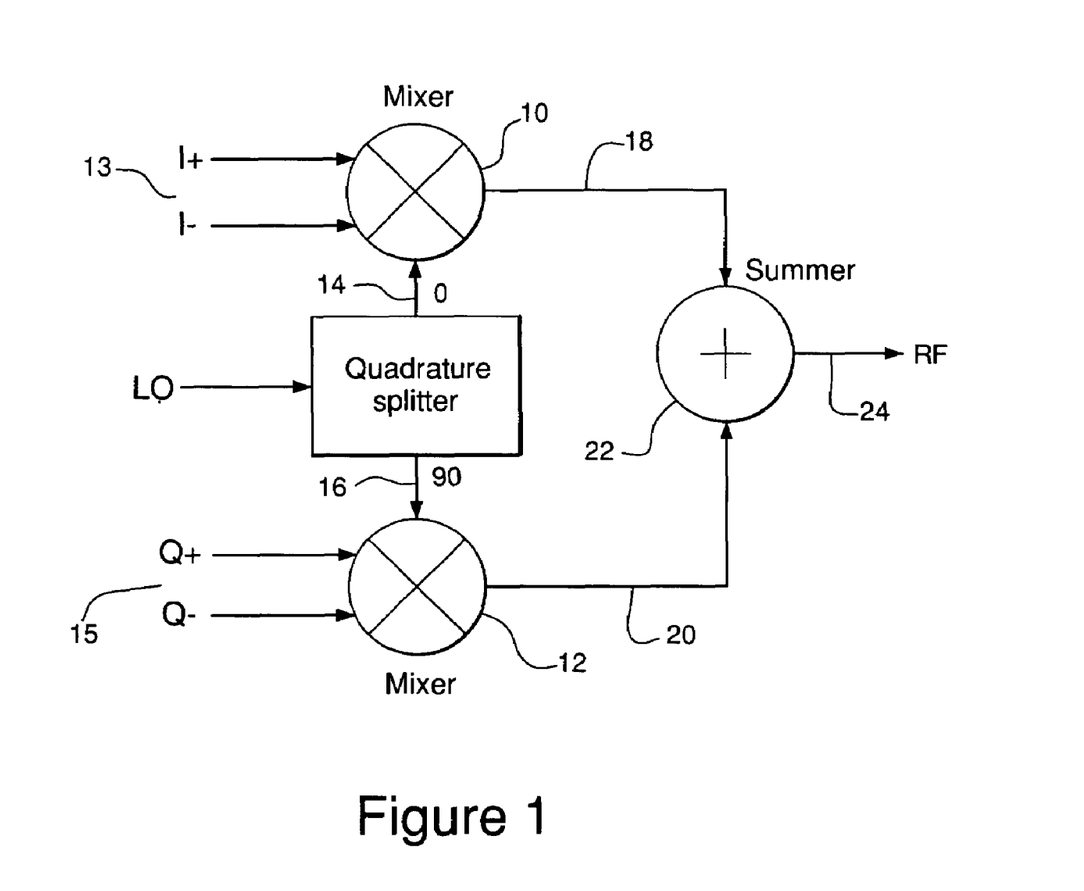
FIG. 1 illustrates a prior-art, quadratic modulator architecture with differential baseband inputs.

The device normally used for direct upconversion is called a quadrature modulator and is shown in FIG. 1. The quadrature modulator of FIG. 1 comprises two mixers 10, 12, which operate with quadrature local oscillator (LO) signals 14, 16 having a 90° phase difference between them. The I and Q baseband signals 13, 15 are produced as differential signals by respective DACs (not shown). The I baseband signal 13 is applied to one mixer 10 and the Q baseband signal 15 is applied to the other mixer 12 such that the RF mixer outputs 18, 20 are amplitude-modulated versions of the LO signal. The RF outputs 18, 20 of the two mixers are then combined at summer 22 to produce the modulated RF carrier 24.

Figure 2:
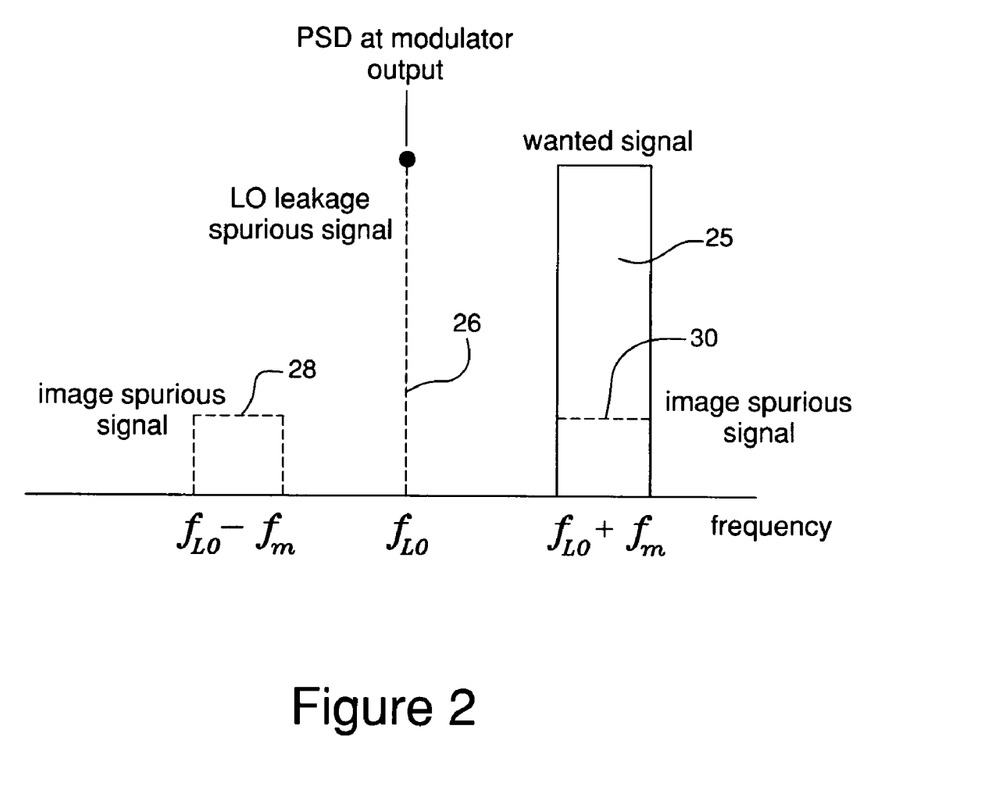
FIG. 2 illustrates spurious signals appearing at the output of the modulator of FIG. 1 due to LO leakage and differential gain and phase errors between the I and Q channels.

The main difficulty with direct upconversion is the generation of spurious signals that are often so close (spectrally) to the wanted signal that they cannot be removed by simple filtering at the modulator output. FIG. 2 shows typical spurious signals for the modulator of FIG. 1. The wanted signal is indicated at 25. The spurious signals of greatest concern are, first, a signal 26 at the LO frequency which is caused by leakage of the LO signal across the mixers 10, 12 to their RF outputs 18, 20 and, second, an 'image' 28, 30 caused by differential gain and phase errors in the I and Q paths.

It can be shown that these particular spurious signals can be removed at the modulator output 24 by modifying the baseband signal applied to the modulator input. This is readily done in the digital domain prior to analogue conversion. The LO leakage signal 26 is removed by adding a dc signal to each I and Q baseband signal such that an additional signal component at the LO frequency appears at the modulator output which has the same amplitude but opposite phase to the LO leakage signal 26. Hence, the LO leakage signal is removed by cancellation. The 'image' 28, 30 is removed by the addition of digital equalisation filters into each I and Q path in advance of the DACs. These filters compensate for the gain and phase ripple and offsets in each path and thereby remove the spurious 'image' signal.

Figure 3:
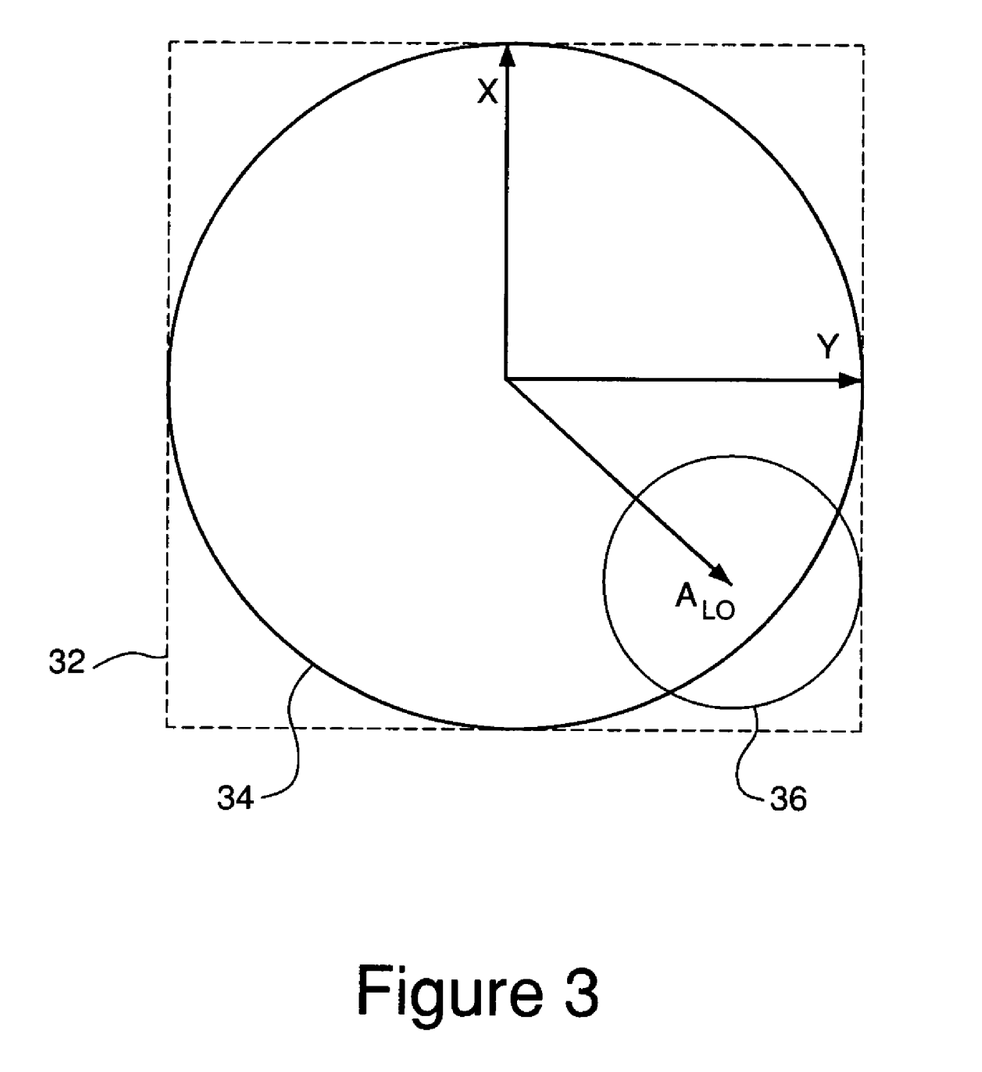
FIG. 3 illustrates permissible ranges of DAC outputs for the modulator of FIG. 1.

A significant problem with digital compensation of LO leakage is the loss of dynamic range (signal-to-noise ratio) from the DAC if the LO leakage signal 26 is too large. This is because the DAC must produce a large dc compensating signal in addition to the wanted signal. This moves the origin of the baseband signal away from zero and reduces the dynamic range available for the wanted baseband signal. This is illustrated in FIG. 3, which will now be discussed.

The vectors X and Y indicate, respectively, the maximum values that can be produced by the DACs that produce the I and Q baseband signals. Therefore, the DAC outputs can specify any point in rectangle 32, which ranges from -|X| to |X| and from -|Y| to |Y|. Commonly, the modulation scheme employed will dictate that the sum of the squares of the moduli of the I and Q baseband signals shall not exceed a maximum value. This has the effect of confining the outputs of the DACs to specifying a point within a circular area within the aforementioned rectangle.

Ordinarily, this circle would be centered upon the origin of the vectors X and Y, which is also the center point of the rectangle 32. In such circumstances, circle 34 represents the largest circle that can be fitted within rectangle 32, and hence the radius of circle 34 indicates the maximum signal level and hence dynamic range that can then be given to the baseband signal. When dc offsets are applied to the I and Q baseband signals to cancel the LO leakage signal 26, the center point of the circle confining the DAC outputs is displaced. In FIG. 3, this displacement is indicated by vector $A_{LO}$, which is the vector sum of the dc offsets. With this new center point, the maximum circle that can be placed within rectangle 32 is circle 36, which is clearly of lesser radius than circle 34 indicating a reduction in the maximum dynamic range of the baseband signal.

Figure 4:
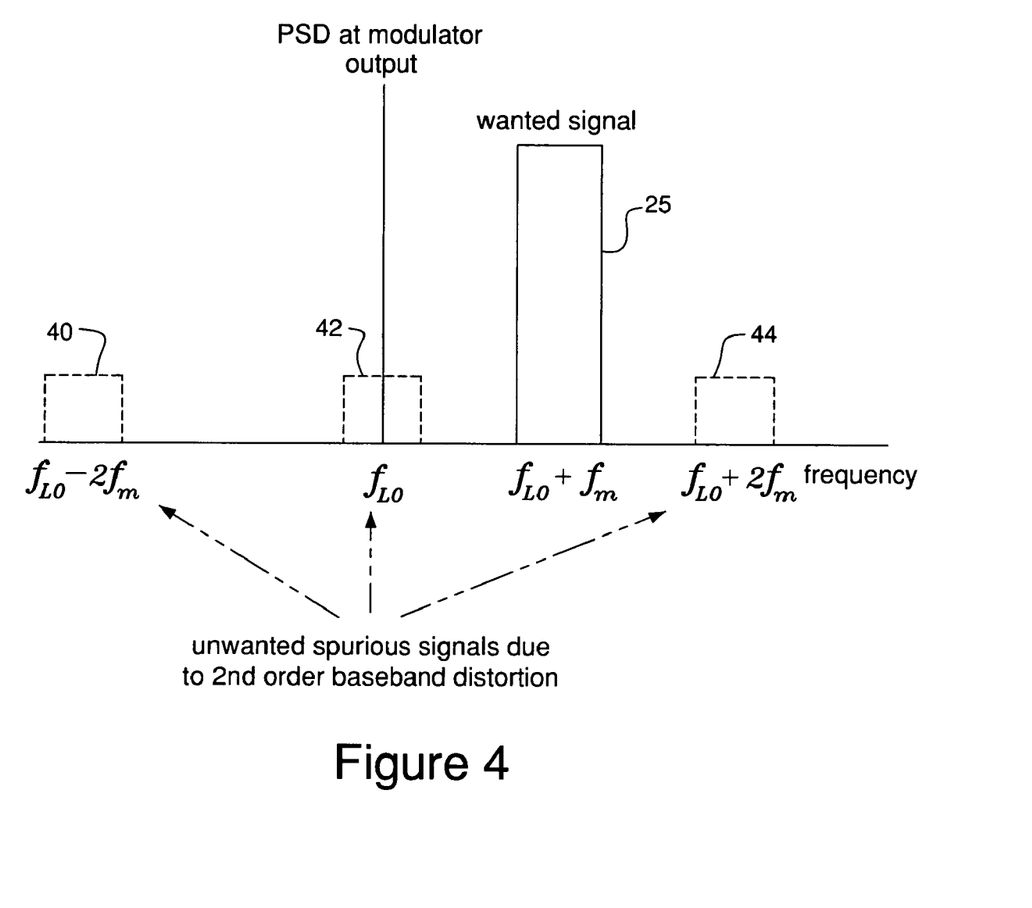
FIG. 4 illustrates spurious signals due to second-order baseband distortion at the output of the modulator of FIG. 1.

Another problem with direct upconversion is distortion of the baseband signal, which results in spurious signals at the modulator output that are often too close (spectrally) to the wanted signal 25 to be easily removed by filtering after the modulator. FIG. 4 illustrates the appearance of three spurious signals 40, 42, and 44 in the vicinity of the wanted signal 25 due to second-order baseband distortion. This distortion can be generated anywhere in the baseband circuit and is often produced in the DACs, the mixers, and baseband buffers (if any).

BRIEF DESCRIPTION OF THE DRAWINGS

By way of example only, the invention will now be described with reference to the accompanying drawings, in which.

DETAILED DESCRIPTION OF THE PREFERRED EMBODIMENTS

According to one aspect, the invention provides apparatus for frequency upconversion of a signal comprising two components, the apparatus comprising two pairs of mixers, each pair adapted to act on a respective one of the components and, in each pair, one mixer adapted to upconvert the component assigned to that pair and the other mixer adapted to upconvert an inverted version of that component; a pair of subtractors, each subtractor adapted to combine by subtraction the outputs of a respective one of the pairs of mixers; and a combiner adapted to combine the outputs of the subtractors to produce an upconverted version of the signal.

The invention also consists in a method of frequency upconversion of an input signal comprising two components, the method comprising a first upconverting step comprising mixing one of the components with a conversion signal to produce a first upconverted signal and mixing an inverted version of that component with the conversion signal to produce a second upconverted signal; a second upconverting step comprising mixing the other of the components with a conversion signal to produce a third upconverted signal and mixing an inverted version of that component with the conversion signal to produce a fourth upconverted signal; a first subtracting step comprising combining by subtraction the first and second upconverted signals to produce a first difference signal; a second subtracting step comprising combining by subtraction the third and fourth upconverted signals to produce a second difference signal; and a combining step comprising combining the first and second difference signals to produce an upconverted version of the input signal.

According to another aspect, the invention provides apparatus for frequency upconversion of a signal, the apparatus comprising a pair of mixers, one mixer adapted to upconvert the signal and the other mixer adapted to upconvert an inverted version of the signal; and a subtractor adapted to combine by subtraction the outputs of the mixers to produce an upconverted version of the signal.

The invention also consists in a method of frequency upconversion of an input signal, the method comprising an upconverting step comprising mixing the input signal with a conversion signal to produce a first upconverted signal and mixing an inverted version of the input signal with the conversion signal to produce a second upconverted signal; and a subtracting step comprising combining by subtraction the first and second upconverted signals to produce an upconverted version of the input signal.

The invention also extends to apparatus for frequency upconversion of an input signal, the apparatus comprising an oscillator adapted to provide a conversion signal, a pair of mixers, one mixer adapted to upconvert the input signal with the conversion signal and the other mixer adapted to upconvert an inverted version of the input signal with the conversion signal; and a combiner adapted to combine the outputs of the mixers to produce an upconverted version of the signal in which leakage of the conversion signal through the mixers is substantially suppressed.

The invention also relates to apparatus for frequency upconversion of a signal, the apparatus comprising a pair of mixers, one mixer adapted to upconvert the signal and the other mixer adapted to upconvert an inverted version of the signal; and a combiner adapted to combine the outputs of the mixers to produce an upconverted version of the signal in which even-order distortion created by the mixers is substantially suppressed.

The invention also provides apparatus for frequency upconversion of a signal, the apparatus comprising two processing paths, each path comprising an amplifier and a mixer, wherein the amplifier and mixer in one path are respectively adapted to amplify and upconvert the signal, and the amplifier and mixer in the other path are respectively adapted to amplify and upconvert an inverted version of the signal; and a combiner adapted to combine the outputs of the paths to produce an upconverted version of the signal in which even-order distortion created by the amplifiers is substantially suppressed.

In the various aspects mentioned above, the invention utilises subtraction in the production of the upconverted signal. In certain embodiments, this subtraction is performed by a balun that combines two signals whilst, at the same time, rotating one of them by 180° in phase.

Moreover, the various aspects of the invention discussed above involve signal inversion. Where a signal to be inverted is a differential signal then, in certain embodiments, the inversion is achieved by swapping the components of the differential signal.

Figure 5:
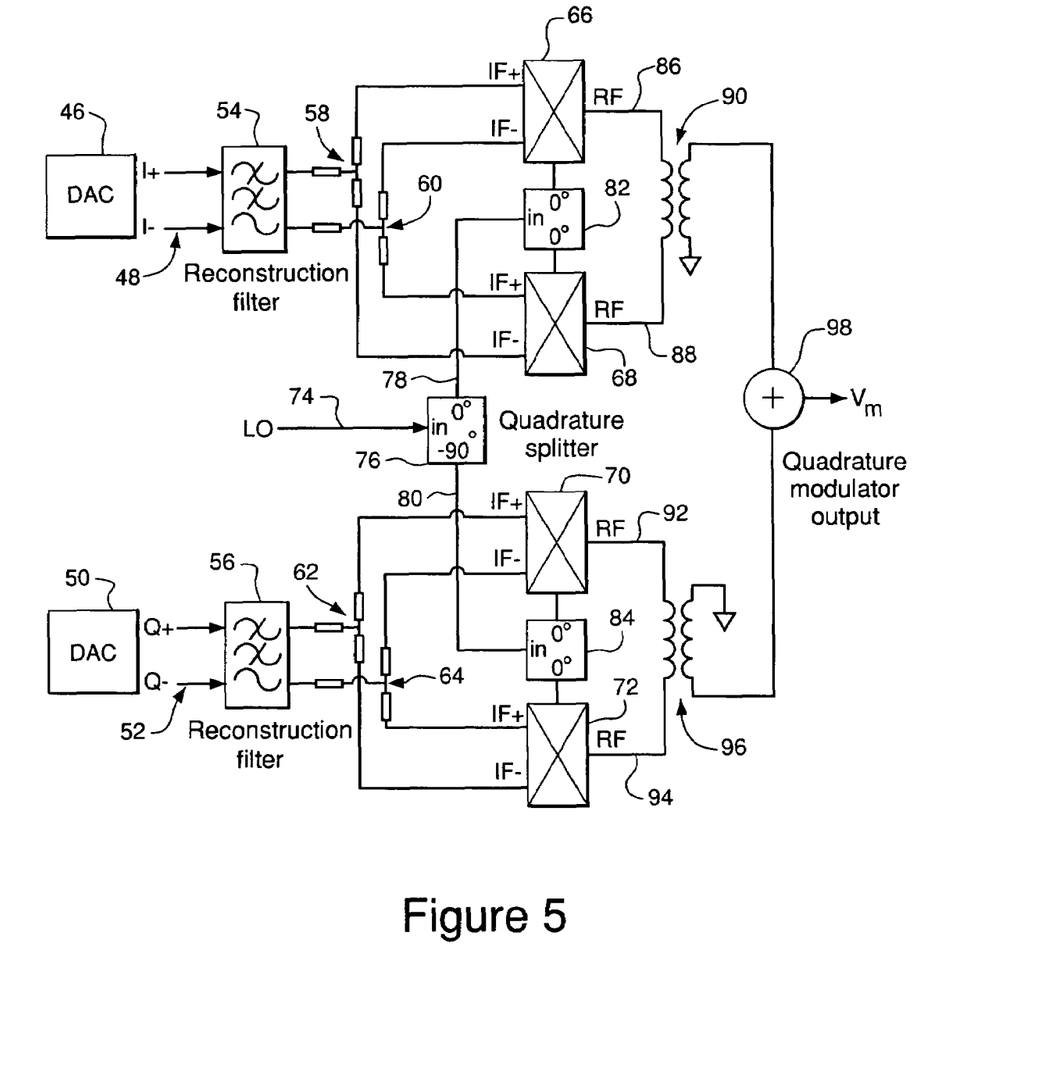
FIG. 5 illustrates a push-pull upconverter.

The upconverter of FIG. 5 is called a push-pull upconverter because of its ability to cancel out certain errors that are introduced by its mixers. The push-pull upconverter of FIG. 5 has certain similarities with the modulator of FIG. 1. The main differences are that the push-pull upconverter uses a pair of mixers in place of each of the mixers 10, 12 of FIG. 1 and that the RF outputs of the mixers are combined in baluns.

Unlike FIG. 1, FIG. 5 illustrates the DACs that produce the I and Q baseband signals. DAC 46 produces a differential I baseband signal 48 comprising an I+ signal and an I− signal. DAC 50 produces a differential Q baseband signal 52 comprising Q+ and Q− signals. The differential I and Q baseband signals 48, 52 are supplied to respective reconstruction filters 54 and 56. The reconstruction filters smooth the relatively rough waveforms of the differential I and Q baseband signals as produced by the DACs 46 and 50.

After passage through the reconstruction filters, each of the I+, I−, Q+, and Q− signals is supplied to a respective resistive splitter 58, 60, 62, and 64. The splitters pass their outputs to four mixers 66, 68, 70, and 72. Each of the mixers has, as shown, an IF+ and an IF− port, each for receiving a part of a differential signal. Mixer 66 receives the signal I+ at its IF+ port from splitter 58 and receives the signal I− at its IF− port from splitter 60. Mixer 66 therefore receives the differential I baseband signal. Mixer 68 receives the signals I− and I+ at its IF+ and IF− ports, respectively, from splitters 60 and 58, respectively. Mixer 68 therefore receives a version of the differential I baseband signal that has been phase-shifted by 180° relative to the version that is supplied to mixer 66. Similarly, mixer 70 receives the signals Q+ and Q− at its IF+ and IF− ports, respectively, from splitters 62 and 64, respectively, and mixer 72 receives the signals Q− and Q+ at its IF+ and IF− ports, respectively, from splitters 64 and 62, respectively. Therefore, mixer 72 receives a version of the differential Q baseband signal that is in antiphase relationship with the version of the differential Q baseband signal that is supplied to mixer 70.

A local oscillator (LO) signal 74 is supplied to a quadrature splitter 76, which emits two versions 78, 80 of the LO signal 74. Signal 80 is a version of the LO signal 74 that has been retarded in phase by 90°, and signal 78 is a version of the LO signal 74 with no phase offset. Signal 78 is applied to mixers 66 and 68 via a further splitter 82, and signal 80 is applied to each of mixers 70 and 72 via a further splitter 84. Hence, mixers 66 and 68 mix oscillator signal 72 with antiphase versions of the differential I baseband signal, and mixers 70 and 72 mix oscillator signal 80 with antiphase versions of the differential Q baseband signal.

RF signals 86 and 88 produced by mixers 66 and 68 are supplied to a balun 90. Balun 90 combines the wanted, modulated signals in phase and combines the LO leakage signals in antiphase such that they cancel. Furthermore, any even-order baseband distortion generated in mixers 66 and 68 or in any baseband buffer amplifiers placed just before the mixers also combines in antiphase and cancel. Balun 90 can be said to subtract one of signals 86 and 88 from the other. The action of balun 90 can be explained mathematically, as follows.

If we consider the pair of mixers 66 and 68 as having baseband inputs defined as $I_1$ and $I_2$, we can write the output from balun transformer 90 as:

$$V_{oi}(t)=I_1(t)\cos(\omega_{LO}t)-I_2(t)\cos(\omega_{LO}t)$$

If we now define the LO leakage from each mixer as $l\cos(\omega_{LO}t+\alpha)$ and add a $2^{nd}$ order (AM-AM) distortion product to the baseband inputs and let $I_2(t)=-I_1(t)$, we obtain:

$$V_{oi}(t)=(I_1(t)+cI_1(t)^2)\cos(\omega_{LO}t)+l\cos(\omega_{LO}t+\alpha)-$$
$$(-I_1(t)+cI_1(t)^2)\cos(\omega_{LO}t)-l\cos(\omega_{LO}t+\alpha)$$

The LO leakage signal and the even order distortion products cancel and we obtain:

$$V_{oi}(t)=2I_1(t)\cos(\omega_{LO}t)$$

as required.

Figure 6:
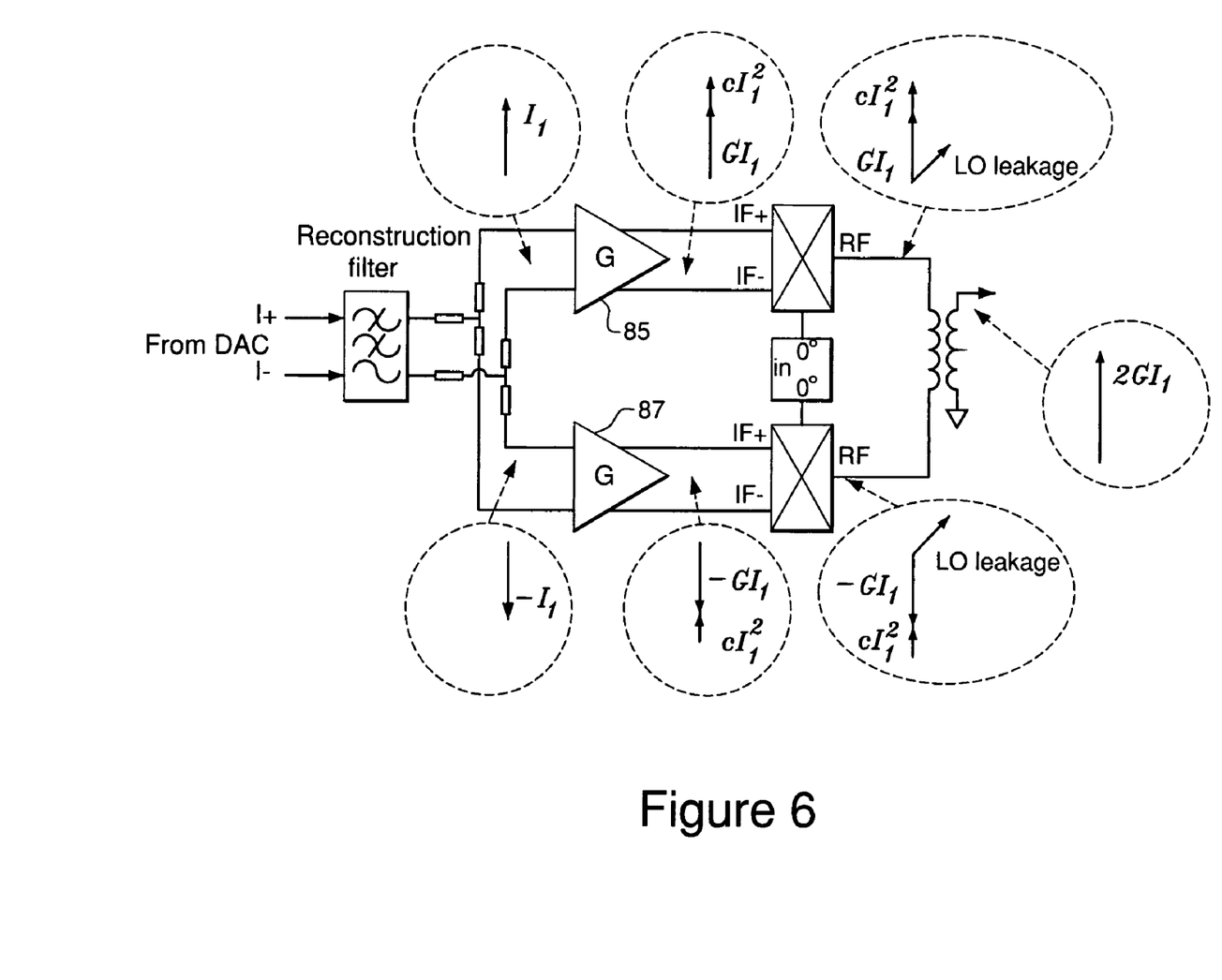
FIG. 6 illustrates the relative direction of signal vectors in the I channel of the upconverter of FIG. 5.

The above mathematical description is supplemented by the diagrammatic representation provided in FIG. 6, which illustrates the relative direction of the signal vectors at various points in the path leading to balun 90. FIG. 6 also illustrates, at 85 and 87, how buffer amplifiers can be included upstream from the mixers.

RF outputs 92 and 94 of mixers 70 and 72 are supplied to another balun 96. Balun 96 operates in the same way as balun 90. That is to say, balun 96 combines the wanted modulated signals in phase, the LO leakage signals in antiphase, and any even-order baseband distortion generated by mixers 70 and 72, or in any baseband buffer amplifiers placed just before them, in antiphase.

The outputs of baluns 90 and 96 are combined by a summer 98 which produces the quadrature modulator output $V_m$.

Relative to RF output 86 or 88 of mixer 66 or 68, the wanted signal power at the output of balun 90 is increased by 3 dB, the LO leakage signal is reduced, and spurious signals due to even-order baseband distortion generated after the resistive splitters is reduced.

In practice, the baluns will not perform perfect cancellation of the targeted spurious signals. This is because a balun will not phase-shift one of its inputs relative to the other by precisely 180°. Another reason is that the mixers that supply RF signals to a given balun will not be precisely the same, leading to a difference in the LO leakage signals that they produce. Hence, even in the circuit of FIG. 5, there often remains a need to introduce dc correction signals to the I and Q baseband signals in the digital domain for the correction of the LO leakage signal. However, the size of the vector $A_{LO}$ will be much smaller than before, leading to a substantial improvement in available dynamic range.

For a given modulator output power, each mixer in FIG. 5 operates with a 3 dB-lower output power than the mixers in FIG. 1. Thus, spurious signals generated by non-linearities in the mixers, and in any buffer amplifiers upstream of the mixers, will be reduced compared to what would be generated in FIG. 1 with mixers of the same type. This reduction in the level of spurious signals is in addition to the cancellation in the baluns of spurious signals due to even-order baseband distortion.

It should also be noted that the highly balanced nature of the circuit of FIG. 5 makes it highly suitable for integration in a single integrated circuit or multi-chip module.

It will be apparent to the skilled person that many modifications can be made to the described embodiment without departing from the scope of the invention. For example, the I and Q baseband signals need not be differential signals, in which case alternative means must be provided for providing the mixers in each pair with antiphase baseband inputs. In another potential variant, the baluns are replaced with solid state subtractors.

I claim:

1. Apparatus for frequency upconversion of a signal comprising two components, said apparatus comprising:
    two pairs of mixers, each pair adapted to act on a respective one of said components and, in each pair, one mixer adapted to upconvert the component assigned to that pair and the other mixer adapted to upconvert an inverted version of that component;
    a pair of subtractors, each subtractor adapted to combine by subtraction the outputs of a respective one of said pairs of mixers, wherein each of said subtractors comprises a balun having the outputs of the corresponding pair of mixers applied to opposite ends of a single balun coil; and
    a combiner adapted to combine the outputs of said subtractors to produce an upconverted version of said signal.

2. Apparatus according to claim 1, wherein said components are differential signals and said apparatus further comprises an inverter adapted to swap the differential subcomponents of each component to produce said inverted versions of said components.

3. Apparatus for frequency upconversion of a signal, said apparatus comprising:
    a pair of mixers, one mixer adapted to upconvert said signal and the other mixer adapted to upconvert an inverted version of said signal; and
    a subtractor adapted to combine by subtraction the outputs of said mixers to produce an upconverted version of said signal, wherein said subtractor comprises a balun having the outputs of the pair of mixers applied to opposite ends of a single balun coil.

4. Apparatus according to claim 3, wherein said signal is a differential signal and said apparatus further comprises an inverter adapted to swap the differential subcomponents of said signal to produce said inverted version of said signal.

5. Apparatus for frequency upcoversion of an input signal, said apparatus comprising:
    an oscillator adapted to provide a conversion signal, a pair of mixers, one mixer adapted to upconvert said input signal with said conversion signal and the other mixer adapted to upconvert an inverted version of said input signal with said conversion signal; and
    a subtractor adapted to combine by subtraction said outputs of said mixers to produce an upconverted version of said signal in which leakage of said conversion signal through said mixers is substantially suppressed, wherein said subtractor comprises a balun having the outputs of the pair of mixers applied to opposite ends of a single balun coil.

6. A method of frequency upconversion of an input signal comprising two components, said method comprising:
   a first upconverting step comprising mixing one of said components with a conversion signal to produce a first upconverted signal and mixing an inverted version of that component with said conversion signal to produce a second upconverted signal;
   a second upconverting step comprising mixing the other of said components with a conversion signal to produce a third upconverted signal and mixing an inverted version of that component with said conversion signal to produce a fourth upconverted signal;
   a first subtracting step comprising combining subtractively the first and second upconverted signals to produce a first difference signal, wherein the first difference signal is produced by applying the first and second upconverted signals to opposite ends of a single coil in a first balun;
   a second subtracting step comprising combining subtractively the third and fourth upconverted signals to produce a second difference signal, wherein the second difference signal is produced by applying the third and fourth upconverted signals to opposite ends of a single coil in a second balun; and
   a combining step comprising combining the first and second difference signals to produce an upconverted version of said input signal.

7. A method of frequency upconversion of an input signal, said method comprising:
   an upconverting step comprising mixing said input signal with a conversion signal to produce a first upconverted signal and mixing an inverted version of the input signal with said conversion signal to produce a second upconverted signal; and
   a subtracting step comprising combining subtractively the first and second upconverted signals to produce an upconverted version of said input signal, wherein the upconverted version of said input signal is produced by applying the first and second upconverted signals to opposite ends of a single coil in a balun.

8. Apparatus according to claim 1, wherein the signal is a baseband signal comprising baseband I and Q components.

9. Apparatus according to claim 3, wherein the signal is a baseband signal.

10. Apparatus according to claim 5, wherein the input signal is a baseband signal.

11. Method according to claim 6, wherein the input signal is a baseband signal comprising baseband I and Q components.

12. Apparatus according to claim 7, wherein the input signal is a baseband signal.

13. Apparatus for frequency upconversion, the apparatus comprising:
   a first mixer adapted to mix first and second signals with a first oscillator signal to generate a first mixed signal;
   a second mixer adapted to mix the first and second signals with a second oscillator signal to generate a second mixed signal;
   a third mixer adapted to mix third and fourth signals with a third oscillator signal to generate a third mixed signal;
   a fourth mixer adapted to mix the third and fourth signals with a fourth oscillator signal to generate a fourth mixed signal;
   a first subtractor adapted to generate a first difference signal by subtracting the first and second mixed signals, wherein the first subtractor comprises a first balun having the first and second mixed signals applied to opposite ends of a single balun coil;
   a second subtractor adapted to generate a second difference signal by subtracting the third and fourth mixed signals, wherein the second subtractor comprises a second balun having the third and fourth mixed signals applied to opposite ends of a single balun coil; and
   a combiner adapted to combine the first and second difference signals to generate a frequency-upconverted output signal.

14. The invention of claim 13, wherein:
   the mixing of the second mixer is a 180-degree phase-shifted version of the mixing of the first mixer; and
   the mixing of the fourth mixer is a 180-degree phase-shifted version of the mixing of the third mixer.

15. The invention of claim 14, wherein:
   the first and second signals are differential baseband signals corresponding to an in-phase component of a QAM signal;
   the third and fourth signals are differential baseband signals corresponding to a quadrature component of a QAM signal;
   the first and second oscillator signals correspond to a local oscillator (LO) signal; and
   the third and fourth oscillator signals correspond to a 90-degree phase-shifted version of the LO signal.

16. The invention of claim 15, further comprising:
   a quadrature splitter adapted to generate an in-phase version of the LO signal and a quadrature version of the LO signal;
   a first splitter adapted to generate the first and second oscillator signals from the in-phase version of the LO signal; and
   a second splitter adapted to generate the third and fourth oscillator signals from the quadrature version of the LO signal.

17. A method for frequency upconversion, the method comprising:
   first mixing first and second signals with a first oscillator signal to generate a first mixed signal;
   second mixing the first and second signals with a second oscillator signal to generate a second mixed signal;
   third mixing third and fourth signals with a third oscillator signal to generate a third mixed signal;
   fourth mixing the third and fourth signals with a fourth oscillator signal to generate a fourth mixed signal;
   generating a first difference signal by subtracting the first and second mixed signals, wherein the first difference signal is generated by applying the first and second mixed signals to opposite ends of a single coil in a first balun;
   generating a second difference signal by subtracting the third and fourth mixed signals, wherein the second difference signal is generated by applying the third and fourth mixed signals to opposite ends of a single coil in a second balun; and
   combining the first and second difference signals to generate a frequency-upconverted output signal.

18. The invention of claim 17, wherein:
   the second mixing is a 180-degree phase-shifted version of the first mixing; and the fourth mixing is a 180-degree phase-shifted version of the third mixing.

19. The invention of claim 18, wherein:

the first and second signals are differential baseband signals corresponding to an in-phase component of a QAM signal;

the third and fourth signals are differential baseband signals corresponding to a quadrature component of a QAM signal;

the first and second oscillator signals correspond to a local oscillator (LO) signal; and the third and fourth oscillator signals correspond to a 90-degree phase-shifted version of the LO signal.

20. The invention of claim 19, further comprising:

generating an in-phase version of the LO signal and a quadrature version of the LO signal;

generating the first and second oscillator signals from the in-phase version of the LO signal; and generating the third and fourth oscillator signals from the quadrature version of the LO signal.

* * * * *